(12) United States Patent
Nambu

(10) Patent No.: US 9,970,597 B2
(45) Date of Patent: May 15, 2018

(54) FLEXIBLE PRINTED CIRCUIT BOARD, PLANAR LIGHT SOURCE APPARATUS, DISPLAY APPARATUS, AND ELECTRONIC DEVICE

(71) Applicant: OMRON Corporation, Kyoto-shi, Kyoto (JP)

(72) Inventor: Kensuke Nambu, Saitama (JP)

(73) Assignee: OMRON CORPORATION, Kyoto (JP)

( * ) Notice: Subject to any disclaimer, the term of this patent is extended or adjusted under 35 U.S.C. 154(b) by 178 days.

(21) Appl. No.: 14/602,989

(22) Filed: Jan. 22, 2015

(65) Prior Publication Data
US 2015/0250047 A1 Sep. 3, 2015

(30) Foreign Application Priority Data

Feb. 28, 2014 (JP) ................. 2014-039924

(51) Int. Cl.
*F21K 9/20* (2016.01)
*H05K 1/11* (2006.01)
(Continued)

(52) U.S. Cl.
CPC ............. *F21K 9/20* (2016.08); *H05K 3/3442* (2013.01); *H05K 1/114* (2013.01); *H05K 1/189* (2013.01);
(Continued)

(58) Field of Classification Search
CPC .......... F21K 9/30; H05K 1/114; H05K 1/118; H05K 1/147
(Continued)

(56) References Cited

U.S. PATENT DOCUMENTS 6,281,450 B1 * 8/2001 Urasaki ................. H01L 21/563
174/258
9,635,759 B2 * 4/2017 Venk ...................... H05K 1/111
(Continued)

FOREIGN PATENT DOCUMENTS

CN 101048030 A 10/2007
CN 100489620 C 5/2009
(Continued)

OTHER PUBLICATIONS

Office Action issued in counterpart Chinese Patent Application No. 201510068303.1, dated Jun. 20, 2017 (14 pages).
(Continued)

*Primary Examiner* — William N Harris
(74) *Attorney, Agent, or Firm* — Osha Liang LLP

(57) ABSTRACT

A flexible printed circuit board on which a first electronic component and a second electronic component are to be mounted adjacent to each other has a first land for soldering a terminal of the first electronic component on a side adjacent to the second electronic component, and a second land for soldering a terminal of the second electronic component on a side adjacent to the first electronic component. The first land and the second land are connected by a wire extending outside of an inter-land region that is an approximately belt-shaped region formed by connecting end portions in a width direction or end portions in a thickness direction of the first land and the second land in a straight line.

12 Claims, 12 Drawing Sheets

(51) Int. Cl.
  *H05K 1/18* (2006.01)
  *H05K 3/34* (2006.01)
(52) U.S. Cl.
  CPC .............. *H05K 2201/09254* (2013.01); *H05K 2201/10106* (2013.01); *H05K 2201/10136* (2013.01); *H05K 2201/10287* (2013.01); *H05K 2201/10295* (2013.01); *H05K 2201/10522* (2013.01); *H05K 2203/046* (2013.01); *Y02P 70/613* (2015.11)
(58) Field of Classification Search
  USPC ........................................................ 361/749
  See application file for complete search history.

(56) References Cited

U.S. PATENT DOCUMENTS

| | | | |
|---|---|---|---|
| 9,655,239 B2* | 5/2017 | Matsuda | H05K 1/142 |
| 2003/0060062 A1 | 3/2003 | Honda et al. | |
| 2006/0114694 A1* | 6/2006 | Cho | G02B 6/0083 |
| | | | 362/631 |
| 2007/0253148 A1* | 11/2007 | Ishizaki | H05K 1/111 |
| | | | 361/600 |
| 2009/0141481 A1 | 6/2009 | Park et al. | |
| 2011/0316014 A1* | 12/2011 | Hiroyuki | F21V 23/005 |
| | | | 257/89 |
| 2012/0113328 A1 | 5/2012 | Takeshima et al. | |
| 2013/0188394 A1* | 7/2013 | Horikawa | F21V 21/00 |
| | | | 362/613 |

FOREIGN PATENT DOCUMENTS

| | | |
|---|---|---|
| CN | 201594360 U | 9/2010 |
| CN | 202972786 U | 6/2013 |
| JP | 2003-101173 A | 4/2003 |
| JP | 2005116685 A | 4/2005 |
| JP | 4058773 B2 | 3/2008 |
| JP | 2009135402 A | 6/2009 |
| JP | 201129634 A | 2/2011 |
| JP | 2013162033 A | 8/2013 |

OTHER PUBLICATIONS

Notification of Reasons for Refusal issued in corresponding Japanese Application No. 2014-039924, dated Oct. 10, 2017 (7 pages).

* cited by examiner

FLEXIBLE PRINTED CIRCUIT BOARD, PLANAR LIGHT SOURCE APPARATUS, DISPLAY APPARATUS, AND ELECTRONIC DEVICE

BACKGROUND

Field

The present invention relates to a flexible printed circuit board (referred to below as "FPC" as well) on which an electronic component is mounted.

Related Art

FPCs with superior thinness and flexibility are used in electronic devices that are smaller and thinner in order to use space efficiently. For example, an FPC on which LEDs (light emitting diodes) are mounted is used in a liquid crystal display as a light source for an edge-lit backlight using a light guide plate.

JP 2003-101173A is an example of background art.

SUMMARY

FIGS. 1A and 1B are diagrams showing an example of a conventional FPC. FIGS. 1A and 1B show an FPC 1A on which multiple LED chips 2 are mounted, which is used as a light source for a backlight of a liquid crystal display apparatus. FIG. 1A is a plan view showing the front surface of the FPC 1A. With the FPC 1A, multiple LED chips 2 are mounted linearly and are connected by wires W0 and WL. A series circuit is constituted in the FPC 1A.

FIG. 1B is a diagram showing a portion of a cross section taken along line AA'. The FPC 1A is constituted by providing the wires W0 (not shown), WL, and lands L on a base material 11 using conductive foil and further adhering a protective cover lay 12 to the front surface thereof. The base material 11 and the cover lay 12 are made of flexible insulating film. Also, the wire pattern of the conductive foil is formed using etching, or the like.

The terminals C of the LED chips 2 are installed on the lands L and are bonded with solder 3. Two LED chips 2 that are mounted adjacent to each other are electrically connected by the belt-shaped wire WL. The wire WL is covered and protected by the cover lay 12. Note that the cover lay 12 is machined using cutting or drilling, for example, and with a machining process, the width of the cover lay 12 covering the wire WL can be reduced to 0.3 mm. However, in general, the machining accuracy for the cover lay 12 is lower than the etching accuracy for the conductive foil according to which precise pattern formation is possible, and the like.

Also, a conventional technique according to which disconnection of the outgoing line of the conductive line caused by bending of the FPC is suppressed has been proposed (e.g., see JP 2003-101173A). With such an FPC, the outgoing line extends in multiple directions from the conductive land for mounting a component, and it is connected to the conductive line at the portion thereof that is covered by the cover lay film.

In recent years, there has been growing demand for FPCs on which electronic components can be mounted at a narrower pitch. For example, there has been increased demand for FPCs on which LEDs can be mounted at a narrower pitch in backlights expected to have a higher brightness. With an edge-lit backlight, in response to the higher brightness requirements, it has conventionally been acceptable to dispose a large number of LEDs along multiple sides of a frame. However, in recent years, in order to realize a larger display region with a smaller size, a narrower frame by which the frame width is further narrowed is required. For this reason, there has been growing demand for more LEDs to be disposed at a narrower pitch concentrated on one side of the frame.

In order to mount electronic components at a narrower pitch on an FPC, the distance between terminals of adjacent electronic components is shortened. However, with the FPC 1A having the structure shown in FIGS. 1A and 1B, since the cover lay 12 covers the wire WL that connects the lands L, the distance between the terminals C cannot be shortened more than the minimum machining dimension of the cover lay 12. In view of this, a configuration in which the wire WL that connects the lands L is not covered by the cover lay 12 will be considered.

FIGS. 2A and 2B are diagrams showing a comparative example of an FPC in which LED chips 2 are mounted at a narrow pitch. FIG. 2A is a diagram showing a partial cross section of an FPC 1B before the LED chips 2 are mounted thereon. With the FPC 1B shown in FIGS. 2A and 2B, the cover lay 12 that covered the wire WL in the conventional FPC 1A shown in FIGS. 1A and 1B is removed, and the adjacent lands L are provided at a narrower pitch than in the FPC 1A.

However, in the comparative example, when soldering, there is a possibility that the molten solder will flow out from one land L to the wire WL, cross the wire WL, and reach the vicinity of another land L. This situation can impede favorable soldering formation. FIG. 2B is a cross-sectional view showing an example in which the LED chips 2 have been soldered to the FPC 1B. If the molten solder flows out from one land L to the vicinity of another land L, as shown in FIG. 2B, there are cases where the solder 3 that bonds adjacent terminals C becomes integrated together. Ordinarily, if soldering is performed normally, in the joint of the bond, the portion of the solder that protrudes from the gap of the joint looks like the foot of a mountain when viewed from the side (see solder 3 in FIG. 1B). Solder with this shape is called a solder fillet. However, in FIG. 2B, solder fillets are not formed.

Thus, if the solder fillets are not formed favorably at the terminals of the electronic components, there is a risk that the bond strength of the terminals will be insufficient. In some cases, peeling or cracking of the solder occurs accompanying a load caused by bending or the like of the FPC, and the electronic components end up separating from the circuit board.

One or more embodiments of the present invention provides a technique according to which multiple electronic components that are to be connected to each other on a flexible printed circuit board can be mounted on the circuit board at a narrower pitch, with favorable solder fillets formed at the terminals of the electronic components.

According to one or more embodiments of the present invention, a flexible printed circuit board on which a first electronic component and a second electronic component are to be mounted adjacent to each other includes a first land for soldering a terminal of the first electronic component on the side adjacent to the second electronic component; and a second land for soldering a terminal of the second electronic component on the side adjacent to the first electronic component, wherein the first land and the second land are connected by a wire that goes outside of an inter-land region that is an approximately belt-shaped region obtained by connecting end portions in a width direction or end portions in a thickness direction of the first land and the second land with a straight line.

With one or more embodiments of the present invention, the wire for electrically connecting the electronic components connects the lands in an indirect manner rather than connecting them in a straight line. For this reason, even if the interval between the two lands is narrow, it is possible to prevent a case in which molten solder flows across the wire from one land to the vicinity of another land when a terminal is soldered. For this reason, a separate configuration such as a cover lay does not need to be provided between the lands, and therefore the interval between the lands can be made smaller. According to one or more embodiments of the present invention, multiple electronic components that are to be connected to each other on a circuit board can be mounted thereon at a narrower pitch, with favorable solder fillets formed at the terminals of the electronic components.

Also, in a flexible printed circuit board according to one or more embodiments of the present invention, the front surface of the flexible printed circuit board may be covered by a cover lay, and an opening may be formed on at least a portion of the cover lay that corresponds to the inter-land region.

According to one or more embodiments of the present invention, it is possible to further shorten the distance between the lands without being influenced by the machining accuracy of the cover lay while the strength of the flexible printed circuit board is maintained by the cover lay.

In a flexible printed circuit board according to one or more embodiments of the present invention, the wire branches and the branched wire may go outside of the inter-land region.

According to one or more embodiments of the present invention, since the wire exposed from the openings in the cover lay branches, it is easier to guide excessive molten solder from the lands to the wire. For this reason, it is possible to provide a flexible printed circuit board in which favorable fillets are easier to form at the terminals.

A flexible printed circuit board according to one or more embodiments of the present invention may have a double-sided structure or a multi-layered structure, and the wire may connect the first land and the second land via a surface or a layer that is different from a surface or layer on which the first land and the second land are provided.

A flexible printed circuit board according to one or more embodiments of the present invention may be obtained by mounting the first electronic component and the second electronic component on the above-described flexible printed circuit board, wherein the first land is bonded to the terminal of the first electronic component on the side adjacent to the second electronic component using solder, and the second land is bonded to the terminal of the second electronic component on the side adjacent to the first electronic component using solder.

Also, in a flexible printed circuit board according to one or more embodiments of the present invention, the first electronic component and the second electronic component may be electronic components that emit light.

According to one or more embodiments of the present invention, it is possible to provide a flexible printed circuit board according to which light is emitted at a higher brightness while flexibility is maintained.

In a flexible printed circuit board according to one or more embodiments of the present invention, the first electronic component and the second electronic component may be LED chips.

According to one or more embodiments of the present invention, a planar light source apparatus includes a flexible printed circuit board according to one or more embodiments of the present invention, and light emitted from the flexible printed circuit board is used as a light source.

According to one or more embodiments the present invention, a display apparatus includes a planar light source apparatus according to one or more embodiments of the present invention, and a display panel configured to receive light emitted from the planar light source apparatus.

According to one or more embodiments of the present invention, an electronic device includes a display apparatus according to one or more embodiments of the present invention.

According to one or more embodiments of the present invention, multiple electronic components that are to be connected to each other on a flexible printed circuit board can be mounted on the flexible printed circuit board at a narrower pitch, with favorable solder fillets formed at the terminals of the electronic components.

DETAILED DESCRIPTION

Hereinafter, embodiments of the present invention will be described with reference to the drawings. Note that the embodiments described hereinafter indicate examples of carrying out the present invention and the present invention is not intended to be limited to the specific configurations described hereinafter. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiment 1

A description will be given in which an LED chip 2 mounted on a front surface is used as an electronic component according to Embodiment 1. Also, a description will be given in which a single-sided FPC is used as a flexible printed circuit board according to Embodiment 1. Note that the electronic component is not limited to being an LED chip 2, and may be a light-emitting electronic component other than an LED, an image sensor, or other electronic component, and it may be an electronic component that is connected by a lead. Also, the flexible printed circuit board may be what is referred to as a flexible printed wire board, a flexible wiring circuit board, or the like.

Overview of Configuration

Figure 1A:
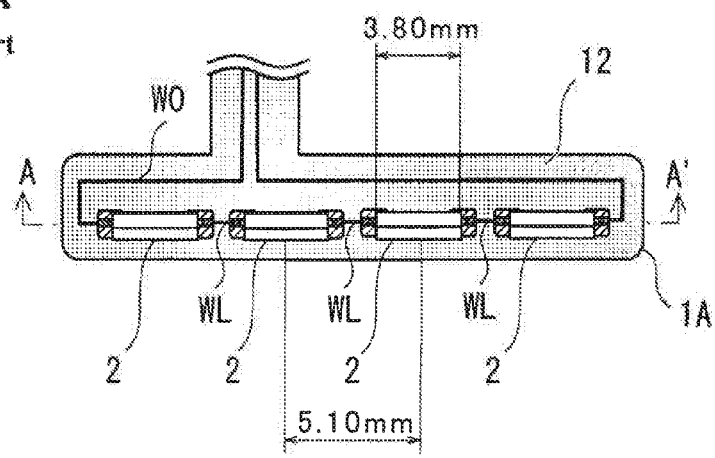
FIGS. 1A and 1B are diagrams showing an example of a conventional flexible printed circuit board.
Figure 3A:
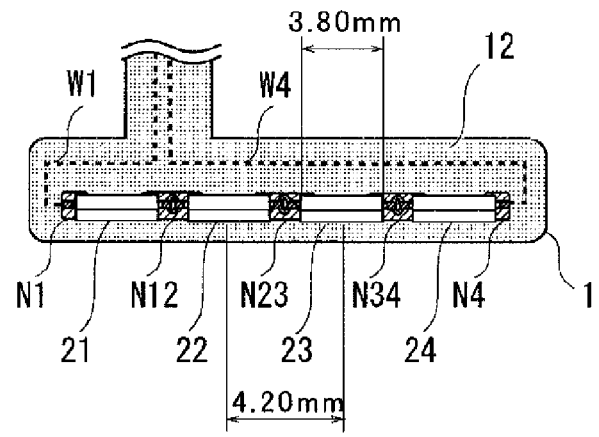
FIGS. 3A to 3C are diagrams illustrating a flexible printed circuit board according to Embodiment 1.
Figure 3B:
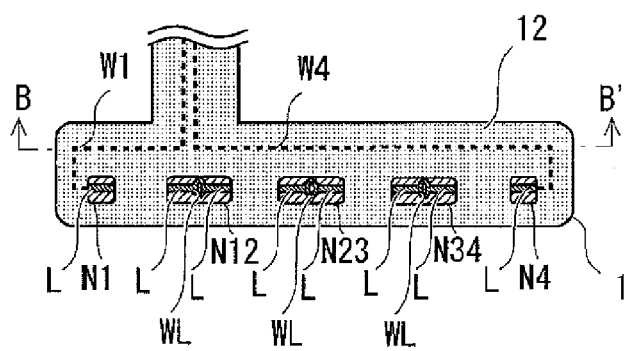
Figure 3C:
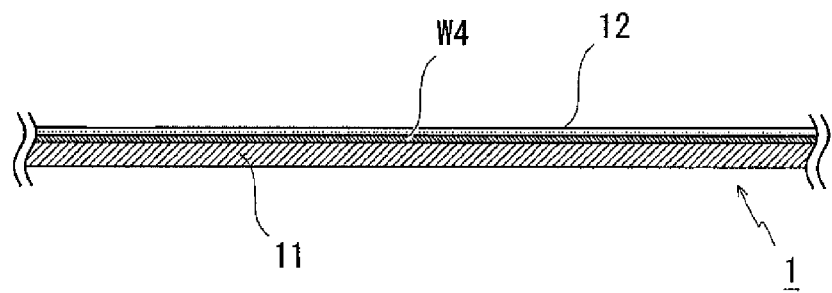

FIGS. 3A to 3C are diagrams illustrating an FPC according to Embodiment 1. FIG. 3A is a plan view illustrating the front surface of an FPC 1. FIG. 3A shows the FPC 1 on which LED chips 21 to 24 are mounted linearly at a predetermined pitch. On the FPC 1 of Embodiment 1, 3.80-mm-wide LED chips 21 to 24 are mounted at a pitch of 4.20 mm, for example. The pitch at which they are mounted is narrower compared to the conventional FPC 1A shown in FIGS. 1A and 1B. Note that the mounting pitch of the LED chips 21 to 24 is not limited to the value described above. Also, with the FPC 1, it is possible to not only mount electronic components such as the LED chips 21 to 24 in a straight line as in Embodiment 1, but also to mount them in a curved line, a bent line, or in multiple lines.

Figure 1B:
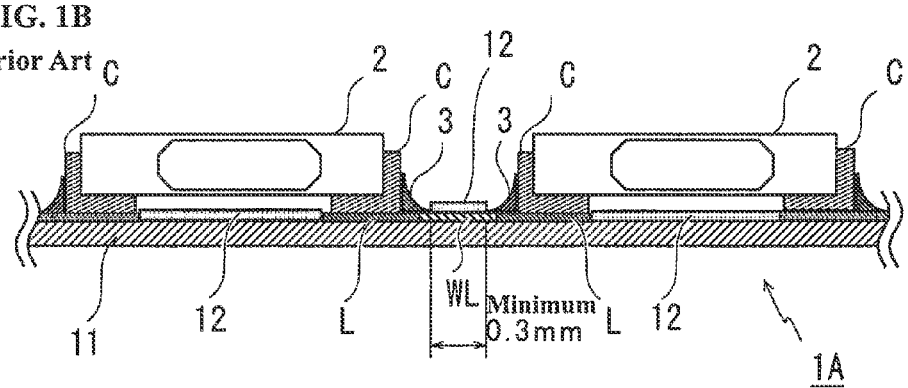

The LED chips 21 to 24 are the same type as the LED chips 2 shown in FIG. 1B. The LED chips 21 to 24 each have left and right terminals C, and each terminal C is connected to a wire provided on the FPC 1.

The front surface of the FPC 1 is largely covered by a cover lay 12 that is an insulating protective film. In the periphery of positions at which the terminals C of the LED chips 21 to 24 are bonded, openings are formed in the cover lay 12 as cover lay opening portions N1, N12, N23, N34, and N4.

The wire W1 connects the LED chip 21 at the cover lay opening portion N1, and the wire W4 connects the LED chip 24 at the cover lay opening portion N4. Wires connecting the LED chips 21 and 22, the LED chips 22 and 23, and the LED chips 23 and 24 are provided at the cover lay opening portions N12, N23, and N34 respectively. Adjacent LED chips 2 are connected. A series circuit is constituted in the FPC 1.

FIG. 3B is a plan view illustrating the FPC 1 before the LED chips 21 to 24 are mounted.

Lands L for bonding the terminals C of the LED chips 2 are provided at the cover lay opening portions N1, N12, N23, N34, and N4. The lands L are conductive regions with a size and shape that allow the terminals C of the LED chips 2 to be placed therein. The lands L of Embodiment 1 are regions constituted by copper foil that are roughly rectangular and are exposed on the surface of the FPC 1 in order for the terminals C to be bonded thereto with solder. Note that the front surfaces of the lands L may be subjected to processing such as solder plating or gold plating. Also, the lands L are not limited to having a roughly rectangular shape, and they may have a circular shape or another kind of shape, according to the terminals of the mounted electronic components. Also, the lands L may be formed from what are called "pads".

Also, inter-land wires WL are provided at the respective wire cover lay openings N12, N23, and N34, and the inter-land wires WL each connect two lands L provided adjacent to each other. The inter-land wires WL illustrated in Embodiment 1 have an elliptical annular shape. The inter-land wire WL will be described below in detail.

FIG. 3C is a diagram showing a partial cross section taken along line BB', which shows the layer structure of the FPC 1. With the FPC 1, the wire W4 serving as a pattern of copper foil is formed by etching or the like on the base material 11, which is made of polyimide film, or the like. Furthermore, the protective cover lay 12, which is similarly made of polyimide film or the like, is adhered to the surface of the FPC 1, Note that the base material 11 and the cover lay 12 may be another material that is flexible and insulating, such as polyester. Also, the wires in the FPC 1 may be constituted by a conductor other than copper foil.

Wires Between Electronic Components

Figure 4A:
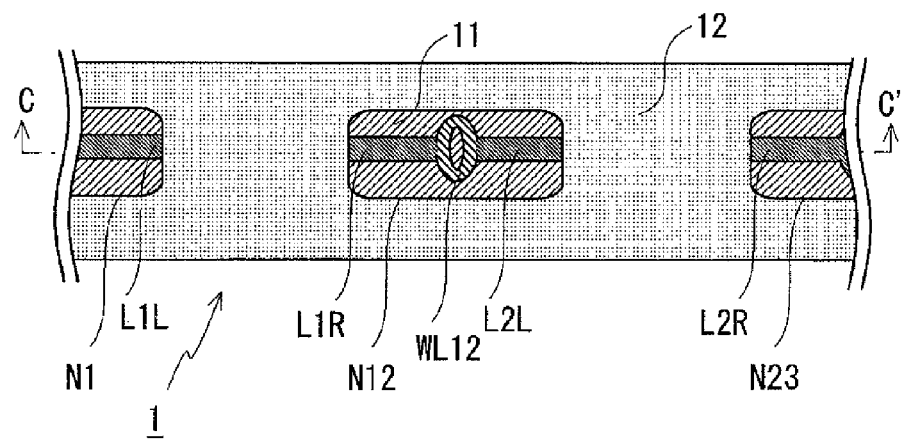
FIGS. 4A and 4B are diagrams illustrating a wire between electronic components on a flexible printed circuit board according to Embodiment 1.
Figure 4B:
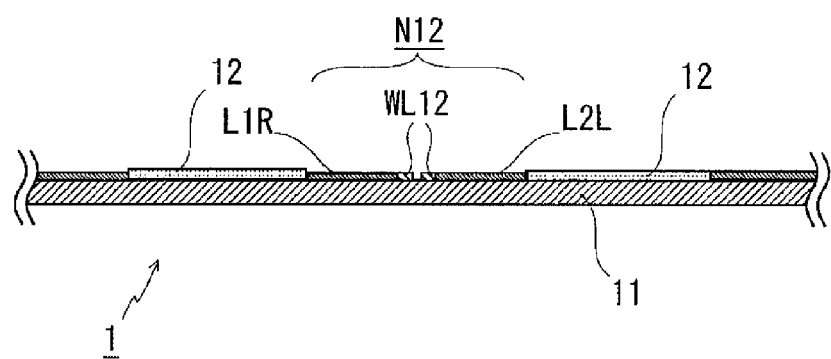

FIGS. 4A and 4B are diagrams illustrating wires between electronic components in the FPC 1 according to Embodiment 1. FIGS. 4A and 4B show the vicinity of the cover lay opening portion N12 in the FPC 1.

FIG. 4A is a plan view of the FPC 1, and FIG. 4B is a cross-sectional view taken along line CC'. Lands L1R and L2L, the inter-land wire WL12, and the base material 11 are exposed at the cover lay opening portion N12. The LED chip 21 and the LED chip 22 can be mounted adjacent to each other in the vicinity of the cover lay opening portion N12. Hereinafter, a description will be given presuming that the LED chip 21 and the LED chip 22 are to be mounted. Here, the LED chip 21 is an example of a first electronic component, and the LED chip 22 is an example of a second electronic component.

The land L1R is a conductive region for bonding the terminal C of the LED chip 21 on the side adjacent to the LED chip 22 with solder. Also, the land L2L is a conductive region for bonding the terminal C of the LED chip 22 on the side adjacent to the LED chip 21 with solder. The land L1R is an example of a first land, and the land L2L is an example of a second land. The inter-land wire WL12 is constituted by copper foil and electrically connects the land L1R and the land L2L.

Figure 5A:
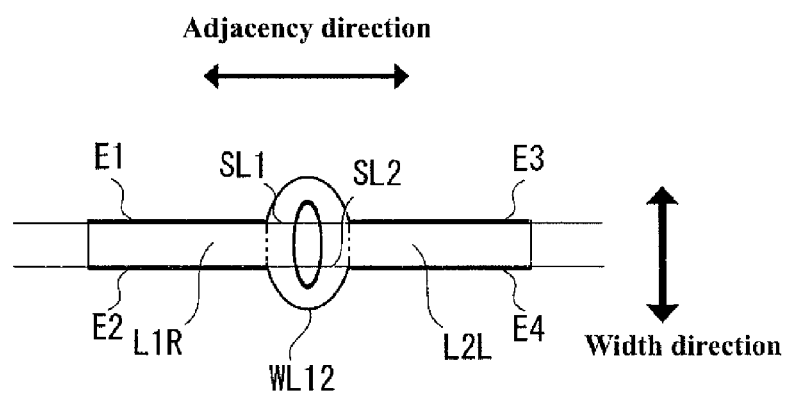
FIGS. 5A and 5B are diagrams for describing an inter-land wire according to Embodiment 1.
Figure 5B:
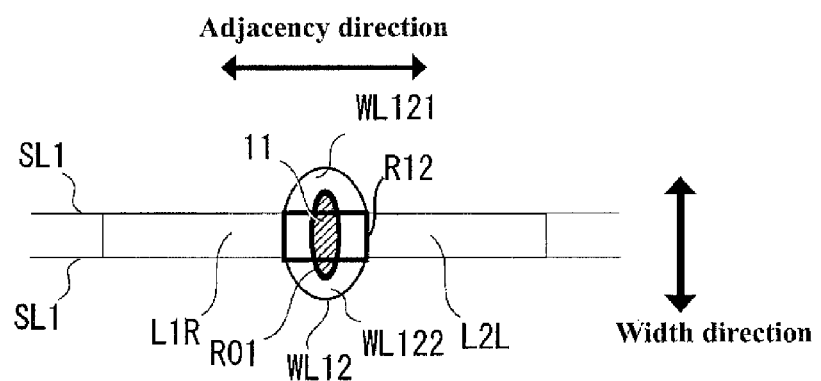

FIGS. 5A and 5B are diagrams for describing the inter-land wire WL12 according to Embodiment 1. FIGS. 5A and 5B show an enlarged view of the lands L1R and L2L, the inter-land wire WL12, and the like. The left-right direction in the drawing is the adjacency direction, and the up-down direction in the drawing is the width direction. The adjacency direction indicates the direction in which the LED chip 21 and the LED chip 22 are adjacent to each other, and more specifically, it can be defined as the direction of a straight line connecting the centroid of the soldering surface of the land L1R and the centroid of the soldering surface of the land L2L. The width direction is the direction perpendicular to the adjacency direction. The connection between the lands L1R and L2L by the inter-land wire WL12 will be described below with reference to FIGS. 5A and 5B.

Straight lines SL1 and SL2 can be formed by connecting the two end portions E1 and E2 (bold lines shown in FIG. 5A) in the width direction of the land L1R and the two end portions E3 and E4 (bold lines shown in FIG. 5A) in the width direction of the land L2L. The region between the lands L1R and L2L that is interposed between the straight lines SL1 and SL2 will be called "inter-land region R12" (bold lines shown in FIG. 5B). The inter-land region R12 is a belt-shaped rectangular region as shown in FIG. 5B. The inter-land wire WL12 connects the land L1R and the land L2L via the outside of the region R12.

The inter-land wire WL12 of Embodiment 1 branches in two. In FIG. 5B, semi-circular arcuate wires WL121 and WL122, which are sectioned off by the straight lines SL1 and SL2, are the branched wires. The branched wires WL121 and WL122 each connect the land L1R and the land L2L via the outside of the inter-land region R12.

An elliptical region R01 surrounded by the inter-land wire WL12 is a region in which the base material 11, which is an insulator, is exposed. In the inter-land region R12, the wire WL12 is divided into the land L1R side and the land L2L side.

Mounting of Electronic Components

The LED chips 2 are mounted on the FPC 1 by soldering. Coating the lands L with cream solder and performing reflow soldering can be used as an example of the soldering method. If the LED chip 21 and the LED chip 22 are to be mounted, the lands L1L, L1R, L2L, and L2R shown in FIGS. 4A and 4B are first coated with the cream solder. Next, the two terminals of the LED chip 21 and the two terminals of the LED chip 22 are placed on the lands L1L and L1R, and the lands L2L and L2R respectively. Next, soldering is performed by melting the cream solder. If soldering is performed normally, solder fillets are formed at the terminals due to surface tension and the like.

When soldering, according to wettability and the like, molten solder on a land spreads to the inter-land wire at which the copper foil is exposed. Flowing of molten solder will be specifically described below with reference to FIG. 5B. For example, molten solder on the land L1R sometimes moves from the land L1R to the land L2L and flows out to the inter-land wire WL12. In this case, the molten solder proceeds into the inter-land region R12. However, the molten solder does not go across the region R01 in FIG. 5B, in which the base material 11, which has extremely low wettability, is exposed. Here, if it is assumed that a large amount of cream solder is applied, the molten solder will flow toward the wires WL121 and WL122, which have high wettability, and an excessive amount can be adjusted. Similarly, the molten solder on the land L2L flows out from the land L2L in the direction of the land L1R, but does not cross the region R01.

Figure 2A:
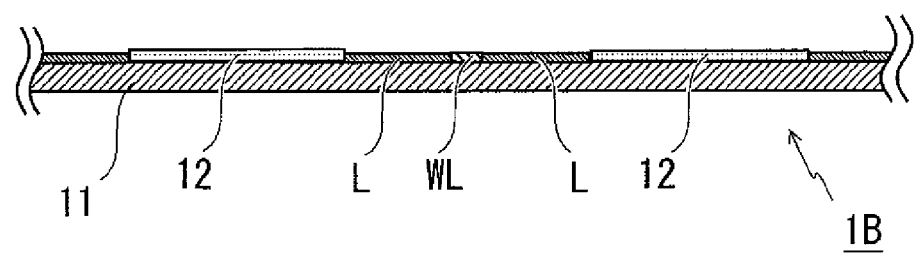
FIGS. 2A and 2B are diagrams showing a comparative example of a flexible printed circuit board on which LED chips are mounted at a narrow pitch.
Figure 2B:
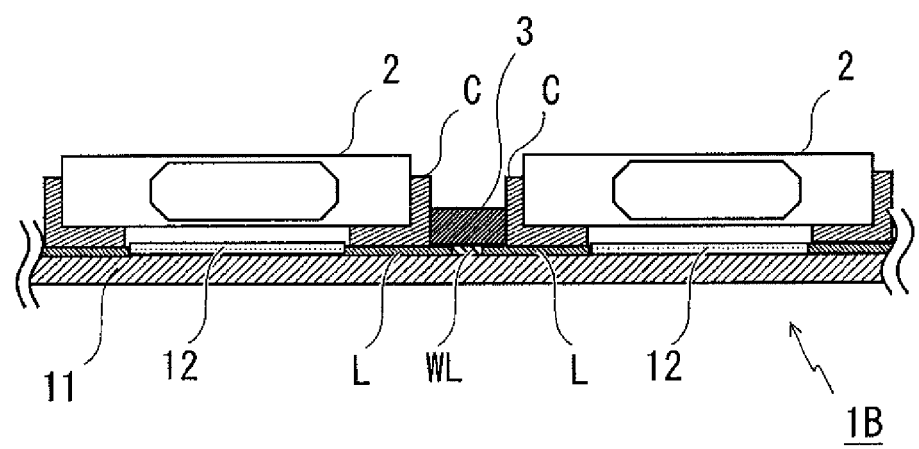

With the FPC 1B according to the comparative example shown in FIGS. 2A and 2B, since the interval between the lands L is small, and the lands L are connected by the exposed inter-land wires WL, it is easy for the molten solder to flow across the inter-land wire WL from one land L to the vicinity of another land L. If this kind of flowing occurs, solder for bonding the terminals C will become integrated, which can prevent favorable solder fillets from being formed between the lands L and the terminals C (see solder 3 in FIG. 2B).

However, with the inter-land wire WL12 of Embodiment 1, the inter-land wire WL12 connects the lands L1R and L2R in an indirect manner rather than connecting them in a straight line. For this reason, even if the interval between the lands L1R and L2L is narrow, it is possible to suppress a case in which molten solder flows across the inter-land wire WL12 from one land to the vicinity of another land. Even if there is an excessive amount of molten solder, the amount of solder can be adjusted. Accordingly, even if the interval between the lands L1R and L2L is small, favorable solder fillets can be formed. In particular, since the inter-land wire WL12 of Embodiment 1 branches in two, the molten solder can flow in a dispersed manner to the two branched wires WL121 and WL122. For this reason, a greater amount of molten solder can be adjusted.

Figure 6A:
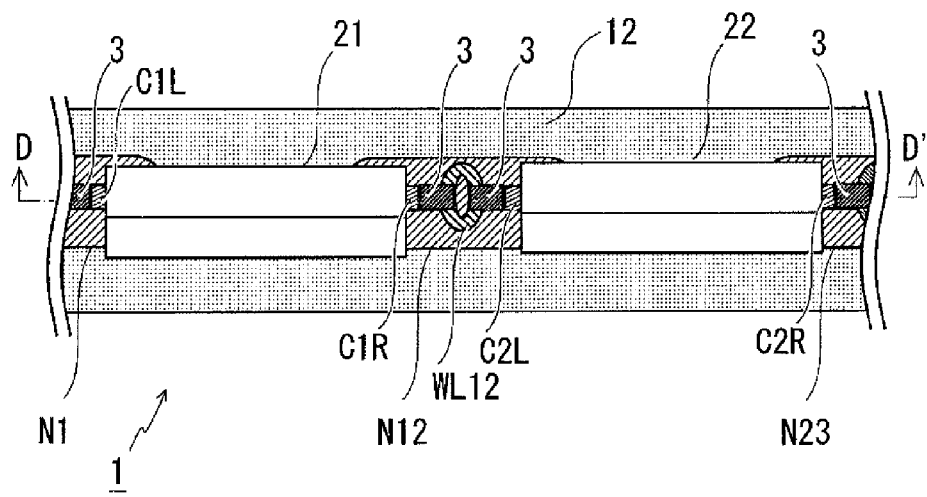
FIGS. 6A and 6B are diagrams illustrating a flexible printed circuit board according to Embodiment 1 on which electronic components have been mounted.
Figure 6B:
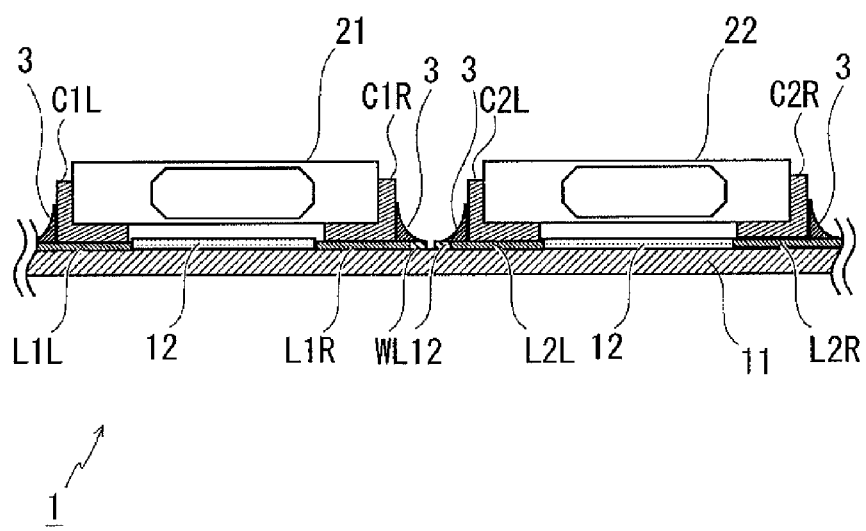

FIGS. 6A and 6B are diagrams illustrating the FPC 1 according to Embodiment 1, on which electronic components have been mounted. FIGS. 6A and 6B show the vicinity of the cover lay opening portion N12 in the FPC 1.

FIG. 6A is a plan view of the FPC 1, and FIG. 6B is a cross-sectional view taken along line DD'.

The LED chip 21 and the LED chip 22 are mounted adjacent to each other on the FPC 1 shown in FIGS. 6A and 6B. The terminal C1L of the LED chip 21 and the land L1L are bonded, the land L1R and the terminal C1R are bonded, the terminal C2L and the land L2L are bonded, and the terminal C2R and the land L2R are bonded by the solder 3. As shown in FIG. 6B, the solder 3 forms solder fillets having a shape that is appropriately inclined at the terminals C1L, C1R, C2L, and C2R. In Embodiment 1, it can be expected that such appropriate solder fillets are formed even if the interval between the lands L1R and L2L is shortened.

With Embodiment 1, formation of favorable solder fillets is facilitated even if the cover lay 12 is not provided on the exposed inter-land wire WL12 connecting the lands L. For this reason, the lands L can be arranged close together regardless of the machining accuracy for the cover lay 12. According to Embodiment 1, it is possible to provide an FPC 1 on which the mutually-connected LED chips 2 can be mounted at a narrower pitch, and according to which favorable solder fillets are formed at the terminals C.

Note that it is also conceivable that resistance to a load such as bending of the FPC 1 will decrease due to the cover lay 12 not being provided on the inter-land wire WL12. However, in Embodiment 1, since favorable solder fillets can be formed, the high bond strength of the terminals can be maintained. For this reason, it is possible to provide an FPC 1 that resists a load of long-term or repeated bending. Also, although the amount of heat generated in the circuit increases accompanying a narrower pitch, which can increase the load due to thermal expansion and the like, it is possible to provide an FPC 1 that is resistant to such a load since favorable solder fillets can be formed.

Other Wire Designs

Figure 7A:
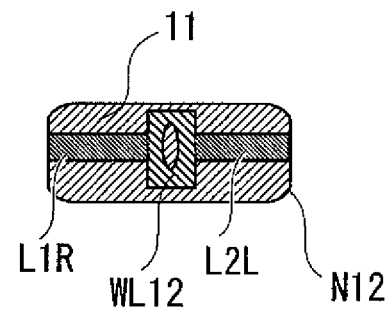
FIGS. 7A to 7C are diagrams illustrating other designs for the wire between the electronic components according to Embodiment 1.
Figure 7B:
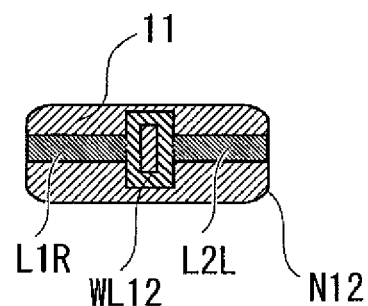
Figure 7C:
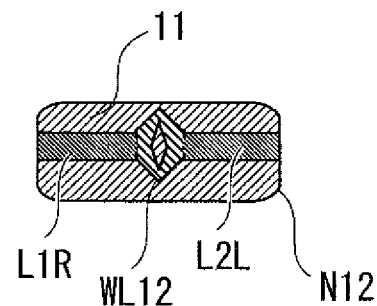

FIGS. 7A to 7C are diagrams illustrating other designs for the wires between the electronic components according to Embodiment 1. FIGS. 7A to 7C show wire designs for the inter-land wire WL12 that is exposed at the cover lay opening portion N12. In all of the wire designs, the inter-land wire WL12 branches in two, similarly to the wire design described above with reference to FIGS. 4A and 4B, and the branched wires connect the lands L1R and L2L in an indirect manner.

Figure 8A:
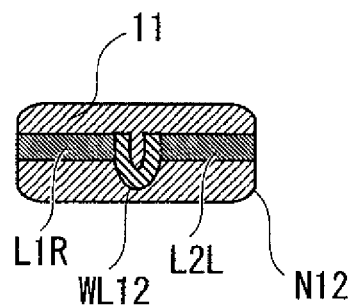
FIGS. 8A to 8C are diagrams further illustrating other designs for the wire between the electronic components.
Figure 8B:
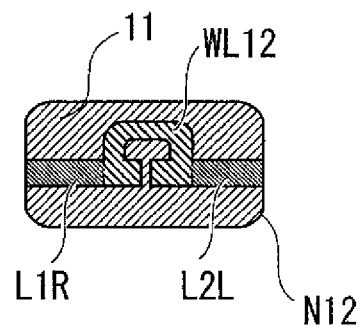
Figure 8C:
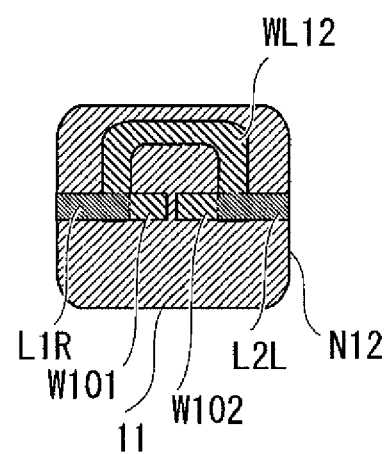

FIGS. 8A to 8C are diagrams further illustrating other designs for the wires between electronic components. FIGS. 8A to 8C show wire designs for the inter-land wire WL12 that is exposed at the cover lay opening portion N12. These wire designs are modified examples of the wire design of Embodiment 1.

In FIG. 8A, the inter-land wire WL12 does not branch. The inter-land wire WL12 connects the lands L1R and L2L in an indirect, semi-circular arcuate manner via the lower side of the drawing.

In FIG. 8B, the inter-land wire WL12 branches in two. One of the branched wires proceeds directly between the lands L1R and L2L but does not connect the lands L1R and L2L. The other branched wire connects the lands L1R and L2L in an indirect manner via the upper side of the drawing.

In FIG. 8C, the inter-land wire WL12 connects the lands L1R and L2L in an indirect manner via the upper side of the drawing. Also, wires W101 and W102 are provided so as to proceed directly between the lands L1R and L2L, but these do not connect the lands L1R and L2L.

All of the above-described inter-land wires WL12 in FIGS. 7A to 7C and FIGS. 8A to 8C are divided into the land L1R side and the land L2L side by the base material 11 in the inter-land region R12 described with reference to FIG. 5B. Also, the inter-land wire WL12 connects the land L1R and the land L2L in an indirect manner. In other words, according to any of these wires as well, it is possible to adjust the flow of the molten solder when performing soldering, and even if the interval between the lands L is narrow, favorable solder fillets can be formed.

Embodiment 2

A description will be given in which a double-sided FPC on whose front surface the LED chips 2 are mounted is used as the flexible printed circuit board according to Embodiment 2. Note that an FPC having a structure with three or more layers may be used.

Similarly to the FPC 1 of Embodiment 1, multiple LED chips 2 are mounted linearly at a predetermined pitch on the front surface of the FPC of Embodiment 2. Wires between the LED chips 2 that are mounted adjacent to each other will be described next.

Figure 9A:
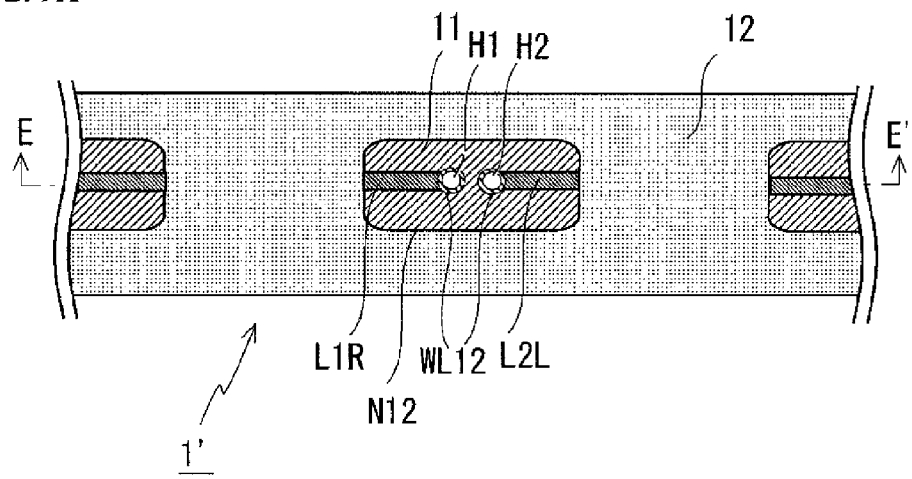
FIGS. 9A and 9B are diagrams illustrating a wire between electronic components on a flexible printed circuit board according to Embodiment 2.
Figure 9B:
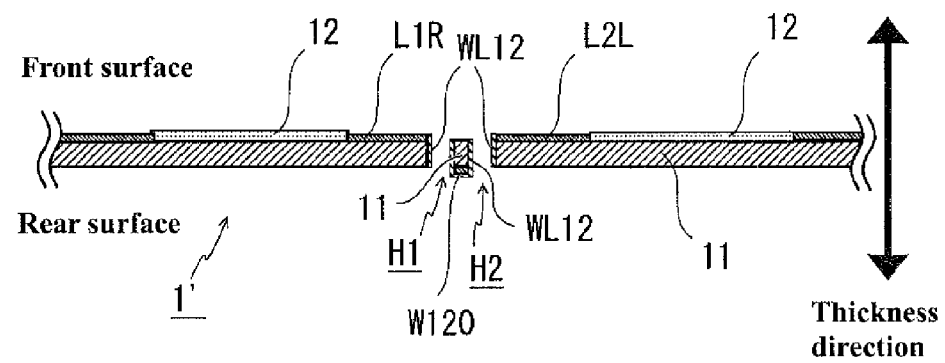

FIGS. 9A and 9B are diagrams illustrating wires between electronic components in the FPC according to Embodiment 2. FIGS. 9A and 9B show the vicinity of the cover lay opening portion N12 in an FPC 1'. FIG. 9A is a plan view showing the front surface of the FPC 1'. Two LED chips 2 can be mounted adjacent to each other in the vicinity of the cover lay opening portion N12. The land L1R, the land L2L, the inter-land wire WL12, and the base material 11 are exposed at the cover lay opening portion N12. Also, through holes H1 and H2 that pass through the FPC 1' in a roughly columnar shape in the thickness direction are provided in the cover lay opening portion N12.

Similarly to Embodiment 1, the lands L1R and L2L are regions for bonding the terminals C of the LED chips 2 with solder. Similarly to Embodiment 1, the inter-land wire WL12 is a member that electrically connects the land L1R and the land L2L. The connection will be described in detail later. The inter-land wire WL12 of Embodiment 2 is copper plating that covers the circumferential walls of the through holes H1 and H2, the side faces on the adjacent sides of the lands L1R and L2L, and the like. A portion of the inter-land wire WL12 forms the circumferential walls of the through holes H1 and H2.

FIG. 9B is a cross-sectional view taken along line EE'. On the rear surface of the FPC 1', a wire W120 that is an approximate rectangular cuboid constituted by copper foil is provided on the base material 11. The inter-land wire WL12 covers the wire W120 as well.

Figure 10A:
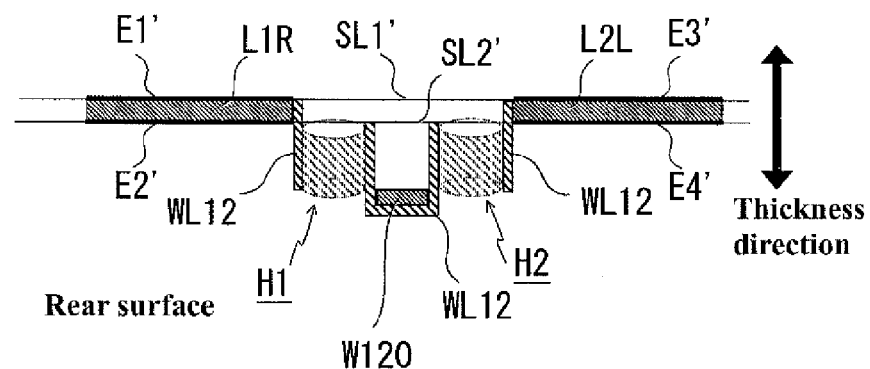
FIGS. 10A and 10B are diagrams for describing an inter-land wire according to Embodiment 2.
Figure 10B:
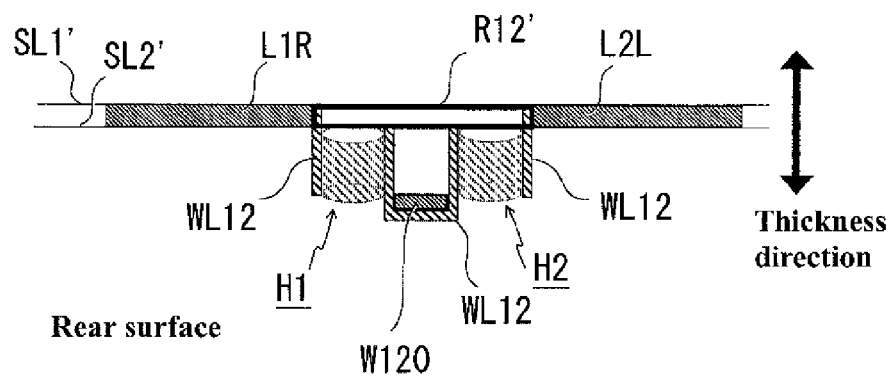

FIGS. 10A and 10B are diagrams for describing the inter-land wire WL12 according to Embodiment 2. FIGS. 10A and 10B show an enlarged view of the land L1R, the land L2L, the inter-land wire WL12, and the wire W120. The upper sides of the drawings are the front surface and the lower sides are the rear surface. The cylindrical shapes shown in the portions of the through holes H1 and H2 represent the circumferential walls of the through holes H1 and H2. The connection between the lands L1R and L2L by the inter-land wire WL12 will be described below with reference to FIGS. 10A and 10B.

Upon connecting the two end portions E1' and E2' (bold line portions in FIG. 10A) in the thickness direction of the land L1R, and the two end portions E3' and E4' (bold line portions in FIG. 10A) in the thickness direction of the land L2L on the adjacent sides, straight lines SL1' and SL2' are formed. The region between the lands L1R and L2L that is interposed between the straight lines SL1' and SL2' is the inter-land region R12' (bold line portion in FIG. 10B). The inter-land region R12' is a belt-shaped region as shown in FIG. 10B. The inter-land wire WL12 connects the land L1R and the land L2L via the outside of the inter-land region R12'. Specifically, the inter-land wire WL12 connects the land L1R and the land L2L via the wire W120 on the rear surface. For example, current that flows from the land L1R flows over the side face on the adjacent side of the land L1R, the circumferential wall of the through hole H1, the wire W120, the circumferential wall of the through hole H2, and the side face of the adjacent side of the land L2L, in the stated order toward the land L2L.

In the inter-land region R12', the inter-land wire WL12 is divided into the land L1R side and the land L2L side.

In Embodiment 2, similarly to Embodiment 1, lands connected by the inter-land wire WL12 can be disposed close to each other regardless of the machining accuracy of the cover lay 12. Furthermore, with the inter-land wire WL12 of Embodiment 2, due to the fact that the inter-land wire WL12 goes through the rear surface and the through holes H1 and H2 are provided, it is possible to adjust the amount of solder even if the amount of solder is more excessive. Accordingly, even if the interval between the lands is narrow, favorable solder fillets are easier to form.

Application

By disposing the multiple LED chips 2 on the FPC 1 or 1' provided by the above-described Embodiment 1 or 2 such that the light emitting faces of the LED chips 2 face the same direction, and by performing soldering such that favorable solder fillets are formed at the terminals, it is possible to provide an FPC with superior flexibility and on which more LED chips 2 are mounted.

Figure 11:
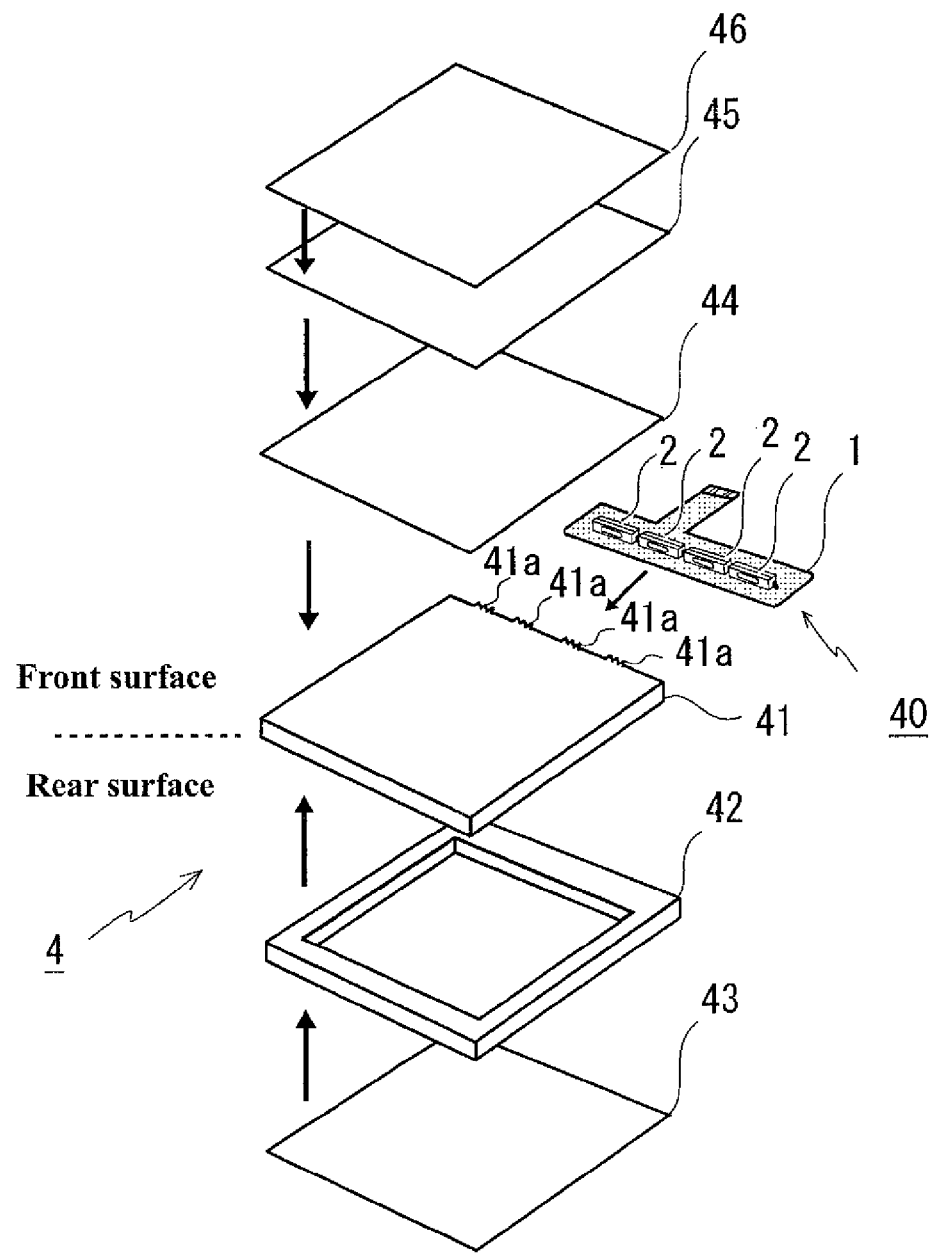
FIG. 11 is a perspective view illustrating a configuration of a backlight that includes a flexible printed circuit board.

Also, it is possible to provide a planar light source apparatus such as a backlight in which the light emitted from the LED chips 2 mounted on the FPC is used as a light source. FIG. 11 is a perspective view illustrating a configuration of a backlight including an FPC. FIG. 11 shows relevant parts of an edge-lit backlight 4 for use in a liquid crystal display. The backlight 4 has a light source unit 40, a light guide plate 41 that receives light from the light source unit 40, a frame 42 and a reflection sheet 43 that are disposed on the rear surface side of the light guide plate 41, and a diffusion sheet 44 and prism sheets 45 and 46 that are stacked in the stated order on the front surface side of the light guide plate 41.

The light source unit 40 is the FPC 1 of Embodiment 1 on which the multiple LED chips 2 are disposed linearly such that the light emitting faces thereof face the same direction and are mounted at a narrow pitch. As described above, favorable solder fillets are formed at the terminals of the LED chips 2.

The light guide plate 41 is a plate-shaped light guide member formed of a transparent material such as polycarbonate resin which uses total reflection to guide light received in the light guide plate 41 from the light source unit 40 to the entire surface of the light guide plate 41 such that the entire surface emits light uniformly. Light receiving portions 41a that have been subjected to knurling are provided on the end surface of the light guide plate 41 at the pitch at which the LED chips 2 are mounted, the number of provided light receiving portions 41a being the same as the number of mounted LED chips 2. The backlight 4 is assembled such that, in order for light to be guided from the light source unit 40 to the light guide plate 41, the light emitting faces of the LED chips 2 in the light source unit 40 are in a positional relationship of facing the respective light receiving portions 41a of the light guide plate 41.

The frame 42 is a frame-shaped member formed of polycarbonate resin or the like in which the outer circumferential surface of the light guide plate 41 is inlaid. The frame 42 reflects light such that the light in the light guide plate 41 does not leak from the outer circumferential surface of the light guide plate 41. The reflection sheet 43 is a film that reflects light such that the light in the light guide plate 41 does not leak from the rear surface of the light guide plate 41.

The diffusion sheet 44 is a sheet that diffuses the light emitted from the surface of the light guide plate 41 so as to make it uniform. The prism sheets 45 and 46 are sheets for condensing the light diffused by the diffusion sheet 44 and increasing the brightness when viewing the backlight 4 from the front.

With the thus-configured backlight 4, light emitted from the light source unit 40 is received in the light guide plate 41 from the light receiving portions 41a, passes through the light guide plate 41, the diffusion sheet 44, and the prism sheets 45 and 46 in the stated order, and is emitted from the front surface side of the backlight 4. This kind of backlight 4 can be expected to have a high brightness since the LED chips 2 are mounted at a narrow pitch in the light source unit 40. Also, the backlight 4 can be a planar light source apparatus having a light emitting face that, although small, is wider since the light source unit 40 is provided on only one side thereof.

Figure 12:
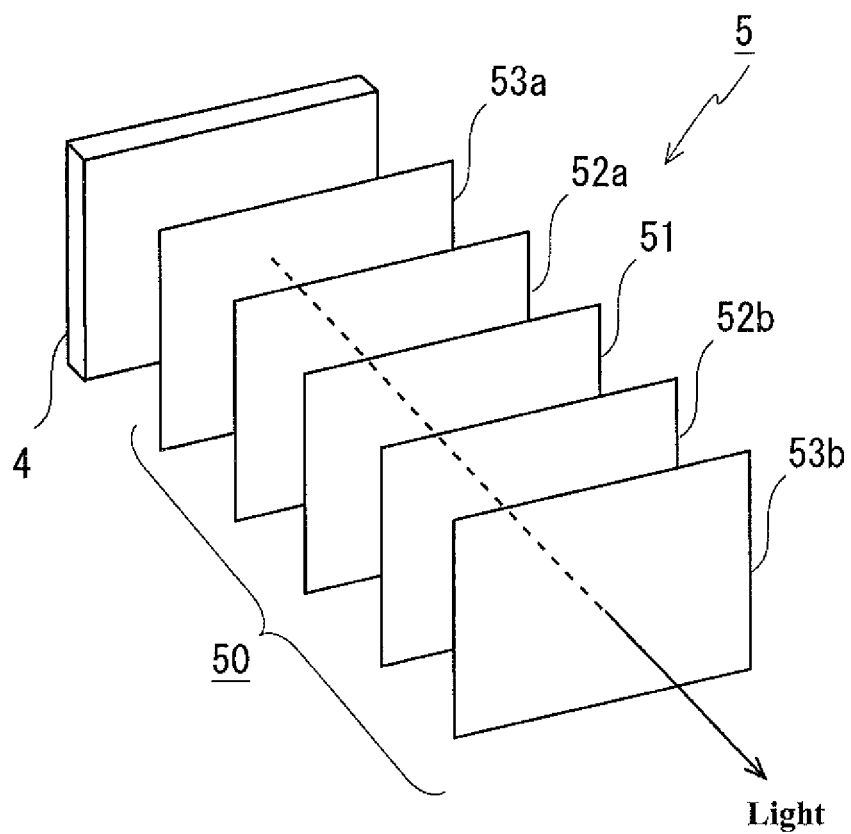
FIG. 12 is a perspective view illustrating a configuration of a liquid crystal display in which a backlight is used as a light source.

Furthermore, it is possible to provide a display apparatus such as a liquid crystal display that includes this kind of backlight 4. FIG. 12 is a perspective view illustrating a configuration of a liquid crystal display in which the backlight 4 is used as the light source. FIG. 12 shows relevant parts of a liquid crystal display 5. The liquid crystal display 5 is constituted by overlaying a liquid crystal panel 50 on the above-described light emitting face of the backlight 4.

The liquid crystal panel 50 is a display panel that displays an image by receiving light emitted from the backlight 4 and applying a voltage to liquid crystal 51 so as to increase or decrease the transmissivity of the light, or the like. The liquid crystal panel 50 is constituted by interposing the liquid crystal 51 between glass plates 52a and 52b and sealing it therein, and further interposing that between a set of polarizing plates 53a and 53b. Light emitted from the backlight 4 passes through the components, namely the polarizing plate 53a, the glass plate 52a, the liquid crystal 51, the glass plate 52b, and the polarizing plate 53b, in the stated order.

The thus-configured liquid crystal display 5 can be expected to have a higher brightness while being small and having a narrow frame.

Furthermore, it is possible to provide an electronic device such as a smartphone, a digital camera, or a tablet terminal that includes this kind of liquid crystal display 5. This kind of electronic device can be expected to provide display at a higher image quality.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A flexible printed circuit board on which a first electronic component and a second electronic component are to be mounted adjacent to each other, comprising:
a first land for soldering a terminal of the first electronic component on a side adjacent to the second electronic component; and
a second land for soldering a terminal of the second electronic component on a side adjacent to the first electronic component,
wherein the first land and the second land are connected by a wire extending outside of an inter-land region that is an approximately belt-shaped region formed by connecting end portions in a width direction or end portions in a thickness direction of the first land and the second land in a straight line,
wherein a front surface of the flexible printed circuit board is covered by a cover lay,
wherein an opening is formed on at least a portion of the cover lay that corresponds to the inter-land region, and
wherein the opening extends continuously across the inter-land region in an adjacency direction of the first and second electronic components.

2. The flexible printed circuit board according to claim 1, wherein the wire branches, and the branched wire extends outside of the inter-land region.

3. The flexible printed circuit board according to claim 1, wherein the flexible printed circuit board has a double-sided structure or a multi-layered structure, and
wherein the wire goes through a surface or a layer that is different from a surface or layer on which the first land and the second land are provided, so as to connect the first land and the second land.

4. A flexible printed circuit board comprising:
a first electronic component and a second electronic component mounted adjacent to each other;
a first land on which a terminal of the first electronic component is soldered, on a side adjacent to the second electronic component; and
a second land on which a terminal of the second electronic component is soldered, on a side adjacent to the first electronic component,
wherein the first land and the second land are connected by a wire extending outside of an inter-land region that is an approximately belt-shaped region formed by connecting end portions in a width direction or end portions in a thickness direction of the first land and the second land in a straight line,
wherein a front surface of the flexible printed circuit board is covered by a cover lay,
wherein an opening is formed on at least a portion of the cover lay that corresponds to the inter-land region, and
wherein the opening extends continuously across the inter-land region in an adjacency direction of the first and second electronic components.

5. The flexible printed circuit board according to claim 4, wherein the first electronic component and the second electronic component are electronic components that emit light.

6. The flexible printed circuit board according to claim 5, wherein the first electronic component and the second electronic component are LED chips.

7. A planar light source apparatus, comprising:
the flexible printed circuit board according to claim 5,
wherein light emitted from the flexible printed circuit board is used as a light source.

8. A display apparatus comprising:
the planar light source apparatus according to claim 7, and
a display panel configured to receive light emitted from the planar light source apparatus.

9. An electronic device comprising:
the display apparatus according to claim 8.

10. A planar light source apparatus, comprising:
the flexible printed circuit board according to claim 6,
wherein light emitted from the flexible printed circuit board is used as a light source.

11. The flexible printed circuit board according to claim 4,
wherein the wire branches, and the branched wire extends outside of the inter-land region.

12. The flexible printed circuit board according to claim 4,
wherein the flexible printed circuit board has a double-sided structure or a multi-layered structure, and
wherein the wire goes through a surface or a layer that is different from a surface or layer on which the first land and the second land are provided, so as to connect the first land and the second land.

\* \* \* \* \*